United States Patent
Wu et al.

(10) Patent No.: US 6,795,315 B1
(45) Date of Patent: Sep. 21, 2004

(54) COOLING SYSTEM

(75) Inventors: Titan Wu, Taipei (TW); Ted Teng, Taipei (TW); Daniel M. R. Chen, Taipei (TW)

(73) Assignee: Leadtek Research Inc., Taipei Hsien (TW)

( * ) Notice: Subject to any disclaimer, the term of this patent is extended or adjusted under 35 U.S.C. 154(b) by 0 days.

(21) Appl. No.: 10/604,545

(22) Filed: Jul. 30, 2003

(30) Foreign Application Priority Data

Apr. 7, 2003 (TW) ...................................... 92205393 U

(51) Int. Cl.[7] .................................................. H05K 7/20
(52) U.S. Cl. ........................ 361/695; 361/694; 361/697; 174/16.3; 165/80.3; 165/104.33
(58) Field of Search ................................. 361/690–697, 361/719, 729; 257/718, 719, 721; 174/16.1, 16.3; 165/80.3, 104.33, 185

(56) References Cited

U.S. PATENT DOCUMENTS

| | | | | |
|---|---|---|---|---|
| 5,963,424 A | * | 10/1999 | Hileman et al. | ............. 361/695 |
| 5,997,266 A | * | 12/1999 | Lecinski et al. | ........ 417/423.14 |
| 6,144,556 A | * | 11/2000 | Lanclos | ........................ 361/695 |
| 6,239,971 B1 | * | 5/2001 | Yu et al. | ...................... 361/695 |
| 6,381,134 B2 | * | 4/2002 | Iwasaki | ........................ 361/695 |
| 6,587,343 B2 | * | 7/2003 | Novotny et al. | ............. 361/698 |
| 2001/0024358 A1 | * | 9/2001 | Bonet | .......................... 361/695 |
| 2003/0174467 A1 | * | 9/2003 | Lu | ............................... 361/695 |

* cited by examiner

*Primary Examiner*—Boris Chervinsky
(74) *Attorney, Agent, or Firm*—Jiang Chyun IP Office

(57) ABSTRACT

A cooling system for cooling an interface card is provided. The cooling system comprises a thermal conductive housing wrapping around a carrier of the interface card and the electronic devices thereon. A pair of fans are set up on the housing to provide a flow of air inside the space between the housing and the carrier so that the heat generated by the operating devices are rapidly carried away. In addition, a fin type heat sink can be incorporated into the space between the housing and the electronic devices to increase the amount of heat transferred away from the operating devices.

11 Claims, 3 Drawing Sheets

COOLING SYSTEM

CROSS REFERENCE TO RELATED APPLICATIONS

This application claims the priority benefit of Taiwan application serial No. 92205393, filed on Apr. 7, 2003.

BACKGROUND OF INVENTION

1. Field of Invention

The present invention relates to a cooling system. More particularly, the present invention relates to an interface card cooling system.

2. Description of Related Art

With the great advance in the electronics industry, the need for high-speed multi-functional computers is increasing. As the functional capacity of each computer continue to increase, the number of electronic devices must increase correspondingly. Due to the high operating speed and the increase in the number of electronic devices, a large quantity of heat is produced inside the computer casing during operation. Because the casing of most computers or the surface of most electronic devices do not have any specially installed ventilation system to carry heat away, temperature inside the computer casing will gradually increase with the period of operation. As the temperature inside the computer casing rises to a definite level, some of the operating electronic devices may fail temporarily or permanently. Similarly, the increasing operating speed of the constituent graphic chip and memory chip inside of a graphic card (a graphic processor unit) also generates a lot of heat in full operation.

To prevent the temporary or permanent failure of a graphic card due to over-heating, the graphic chip and the memory chip within the graphic card must be maintained within an operating temperature range. In general, the heat produced by the graphic chip and the memory chip can be carried away using a cooling system.

At present, the most common cooling systems for the graphic card includes the passive cooling system and the active cooling system. The passive cooling system relies on a highly conductive metallic or alloyed heat sink to carry the heat away. The heat sink comprises a cooling plate and a plurality of fins attached to the cooling plate. The cooling plate is made to contact the surface of a graphic chip through a mounting fixture so that the heat produced by the operating graphic chip is transmitted to the cooling plate and the surface of the cooling fins and subsequently dissipated to the surrounding atmosphere.

To boost the heat dissipating capacity of the passive cooling system, an active cooling system with a cooling fan installed over or on one side of the heat sink. The cooling fan provides a stream of air over the channel between the cooling fins of a heat sink. Hence, the active cooling system utilizes both conduction and convection to carry the heat away from the graphic chip. Due to the generation of vast quantities of heat in a high-speed graphic chip, the graphic chips can no longer be maintained within a normal operating temperature range through a passive cooling system alone. Therefore, an additional active cooling system must be installed on the graphic chip of a graphic card.

However, as the operating frequency of the graphic card is increased, the actual heat sources are no longer confined to the graphic chips or the memory chip. In other words, other electronic components (such as capacitor or inductance) on the graphic card can also be major sources of heat production. Thus, a conventional active cooling system can carry the heat away from the graphic chip and the memory chip but has no power to remove the heat from the other heat-generating electronic components.

SUMMARY OF INVENTION

Accordingly, one object of the present invention is to provide a cooling system for an interface card capable of removing most of the heat generated by electronic devices within the card so that these electronic devices are maintained within a normal operating temperature range. Ultimately, electrical performance of the interface card is greatly improved.

To achieve these and other advantages and in accordance with the purpose of the invention, as embodied and broadly described herein, the invention provides a cooling system for an interface card. The interface card comprises a circuit board and a connection interface. The circuit board also has a circuit carrier. The connection interface is attached to one of the side edges of the carrier. The carrier furthermore comprises a front surface, a back surface and a lead-plugging section located on another side edge of the carrier. The cooling system comprises a thermal conductive housing that encloses at least a portion of the circuit carrier but exposes the lead-plugging section. Thus, a space is provided between the front surface of the circuit carrier and the thermal conductive housing. In addition, the thermal conductive housing has an air inlet and an air outlet linking up the enclosed space. An air intake fan is installed at the air inlet and an air exhaust fan is installed at the air outlet of the thermal conductive housing.

According to one embodiment of this invention, the air inlet and the air outlet are positioned over the front surface of the carrier.

According to another embodiment of this invention, the thermal conductive housing furthermore comprises an intake air guiding section and an exhaust air guiding section. The air intake guiding section is set up over the air inlet of the thermal conductive housing and the air exhaust guiding section is set up over the air outlet of the thermal conductive housing. Furthermore, the direction of air flow provided by the air intake guiding section and the direction of air flow provided by the air exhaust channel section form an included angle smaller than 180°.

According to one embodiment of this invention, the cooling system furthermore comprises a fin type heat sink heat sink. The circuit board furthermore comprises at least an electronic device set up on the front surface of the carrier. The heat sink is installed between the electronic device and the thermal conductive housing such that one side of the heat sink is in contact with the electronic device while the other side of the heat sink is in contact with the interior surface of the thermal conductive housing.

According to one embodiment of this invention, the cooling system furthermore comprises a thermal conductive buffer layer installed between the thermal conductive housing and the fin type heat sink.

According to one embodiment of this invention, the air inlet and the air outlet are positioned over the front surface of the carrier but located on each side of the heat sink.

According to one embodiment of this invention, the thermal conductive housing furthermore comprises a top cover positioned over the front surface of the carrier and a back plate covering the back surface of the carrier. Moreover, at least one side of the back plate has direct connection with a corresponding side of the top cover.

According to one embodiment of this invention, the side edge of the back plate and the corresponding side edge of the top cover are joined together through a detachable connection.

According to one embodiment of this invention, one of the side edges of the top cover has a latching hook and the corresponding side edge of the back plate has a corresponding groove for the latching hook so that the two can be latched together after the latching hook is placed inside the groove.

According to one embodiment of this invention, one of the side edges of the top cover has a groove for accommodating a latching hook and the corresponding side edge of the back plate has a corresponding latching hook so that the two can be latched together after the latching hook is placed inside the groove.

According to one embodiment of this invention, one of the side edges of the back plate has an embedding groove for accommodating one side edge of the carrier.

In brief, the cooling system of this invention comprises a thermal conductive housing that wraps around the circuit carrier and the electronic devices of an interface card and a pair of fans installed on the thermal conductive housing. The fans on the thermal conductive housing provide a continuous stream of cool air in the space between the interface card and the thermal conductive housing. With this setup, heat generated by the electronic devices inside the interface card during operation is rapidly carried away. In addition, this invention also permits the attachment of fin type heat sink between the electronic devices having a high heat-generating capacity and the thermal conductive housing to increase the cooling rate even further.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
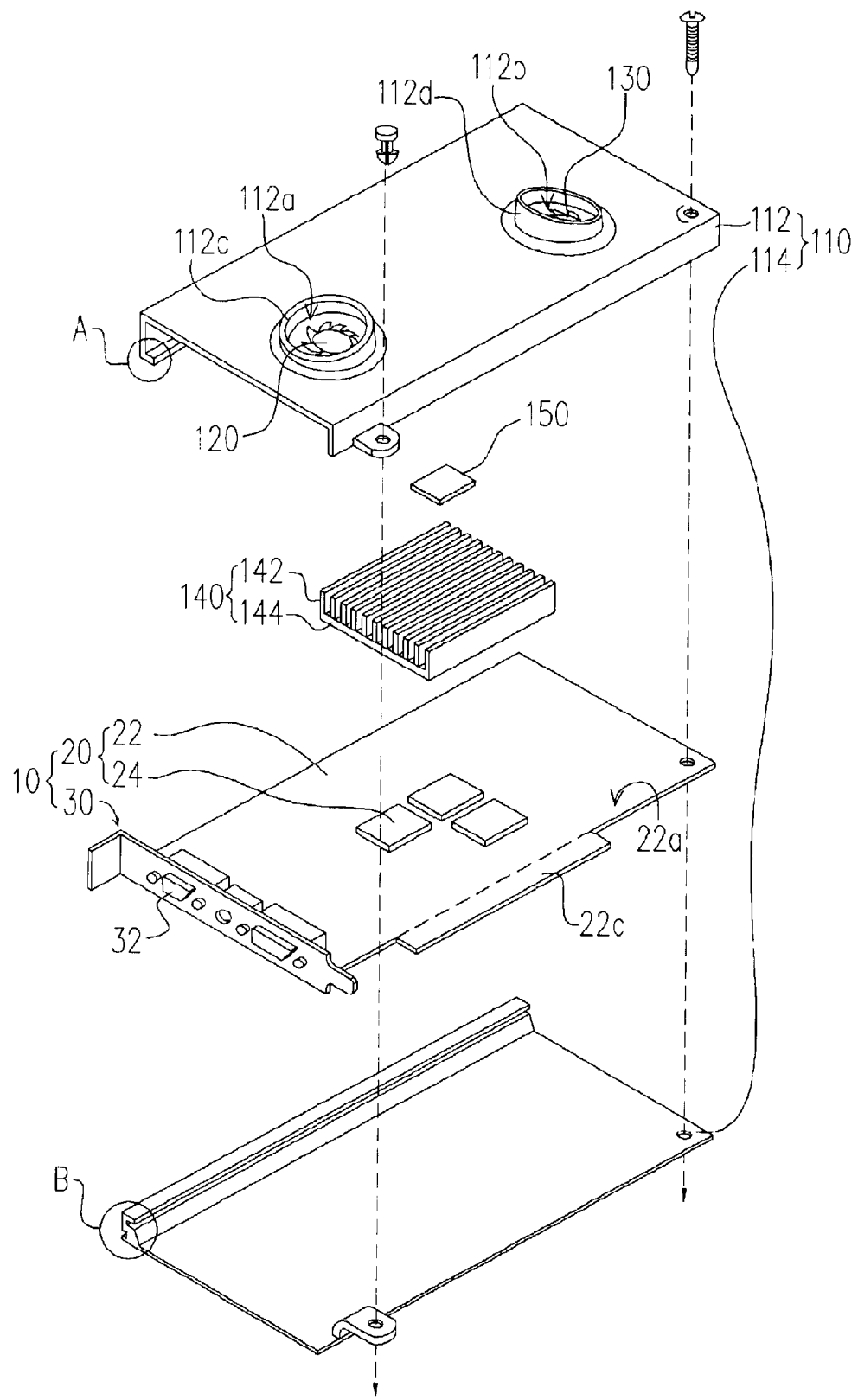
FIG. 1 is an explosion view showing all the major components of a cooling system for ventilating an interface card according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
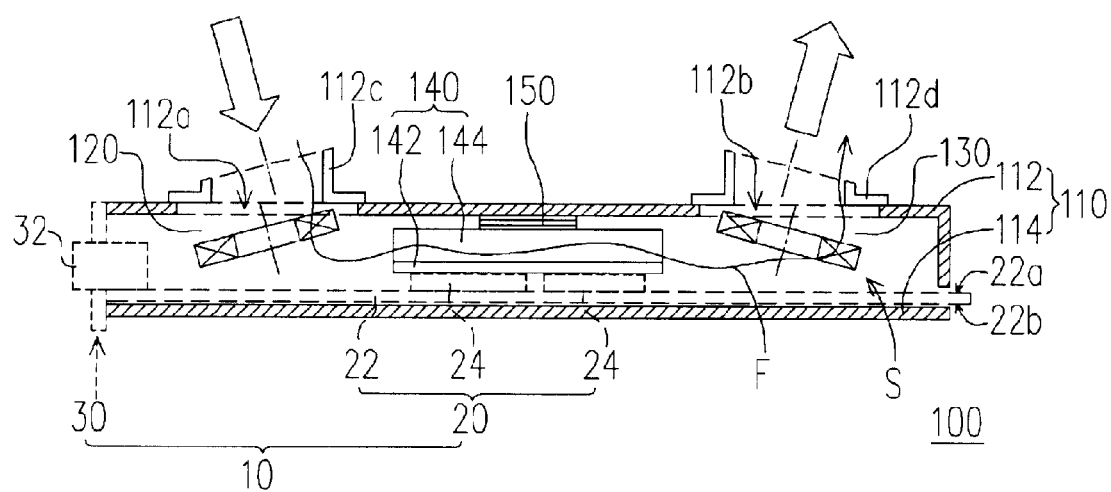
FIG. 2 is a schematic cross-sectional view of an assembled cooling system for ventilating an interface card according to one preferred embodiment of this invention.

FIG. 1 is an explosion view showing all the major components of a cooling system for ventilating an interface card according to one preferred embodiment of this invention. FIG. 2 is a schematic cross-sectional view of an assembled cooling system for ventilating an interface card according to one preferred embodiment of this invention. As shown in FIGS. 1 and 2, the cooling system 100 is adapted to an interface card 10 such as a graphic card. The interface card 10 comprises a circuit board 20 and a connection interface 30. The circuit board 20 furthermore comprises a circuit carrier 22 and a plurality of electronic devices 24 (only three devices are shown). These electronic devices 24 (for example, combinatorial logic chips, memory chips or other types of devices) are attached to the front surface 22a of the carrier 22 using surface mount technology (SMT) or via a pin through hole assembly (PTH). In addition, the carrier 22 has a lead plugging section 22c on one side edge so that the interface card 10 is electrically connected to the mother board of a computer system through the lead plugging section 22c and a connection socket (not shown) on the mother board. The connection interface 30 also has a plurality of connection ports 32 for connecting with the external signal connector of an electronic device such as a monitor screen.

The cooling system 100 of this invention mainly comprises a conductive thermal casing 110, an air intake fan 120 and an air exhaust fan 130. The thermal conductive housing 110 comprises a top cover 112 and a back plate 114. The top cover 112 hangs over the front surface 22a of the carrier 22 while the back plate 114 covers the back surface 22b of the carrier 22. The two opposite side edges of the back plate 114 have screw locks or latching mechanism for engaging with a corresponding side edges of the top cover 112. Hence, the assembled thermal conductive housing 110 is able to enclose a large section of the circuit board 22 as well as the electronic devices 24 on the interface card 10 but expose the lead plugging section 22c of the carrier 22. The assembled thermal conductive housing 110 also provides a space S between the thermal conductive housing 110 and the front surface 22a of the carrier 22. Moreover, the top cover 112 of the thermal conductive housing 110 has an air inlet 112a and an air outlet 112b. The air inlet 112a and the air outlet 112b are positioned over the front surface 22a of the carrier 22 and both are linked to the space S.

The air intake fan 120 is mounted over the air inlet 112a and the air exhaust fan 130 is mounted over the air outlet 112b of the thermal conductive housing 110. With this ventilation setup, the air intake fan 120 blows a flow of cool outside air into the space S and along the flow direction F as shown in FIG. 2. The airflow along the flow direction F absorbs some of the heat produced by various electronic devices 24 as it moves inside the confined space S. Finally, the heated air is expelled from the space S by the exhaust fan 130. In other words, the heat produced by the electronic devices 24 within the space S confined by the thermal conductive housing is rapidly dissipated to the surrounding through a forced convection current.

However, the warmer exhaust air from the air outlet 112b must be prevented from drawing back to the air inlet 112a by the air intake fan 120 to dilute the colder air. Hence, the top cover 112 of the thermal conductive housing 110 may further includes an air intake guiding section 112c and an air exhaust guiding section 112d. The air intake guiding section 112c is set up over the air inlet 112a of the top cover 112 while the air exhaust guiding section 112d is set up over the air outlet 112b of the top cover 112. In addition, the air intake direction at the air intake guiding section 112c and the air exhaust direction at the air exhaust guiding section 112d form an included angle smaller than 180°. Therefore, the air flowing into the air inlet 112a is prevented from mixing with the air flowing out of the air outlet 112b. Ultimately, the heat transfer capacity of the cooling system 100 due to forced convection is improved.

If the interface card 30 is a graphic card, the electronic devices 24 on the graphic card most likely include a graphic chip and a memory chip. Since these electronic devices 24 generate lots of heat during operation, a fin type heat sink 140 can be incorporated into the cooling system 100. The heat sink 140 actually comprises a cooling plate 142 and a plurality of cooling fins 144 with each cooling fin attached to the surface of the cooling plate 142. The heat sink 140 can be installed between the top cover 112 of the thermal conductive housing 110 and at least one of the electronic devices 24. Furthermore, the flat surface of the cooling plate 142 is in direct contact with the heat-generating electronic device 24 while the end of the cooling fins 144 are in direct contact with the interior surface of the top cover 112.

The cooling system 100 furthermore comprises a thermal conductive buffer layer 150 between the fins 144 of the heat sink 140 and the interior surface of the top cover 112 of the thermal conductive housing 110. In other words, the heat sink 140 contacts the interior surface of the top cover 112 indirectly through the thermal conductive buffer layer 150. With this setup, the heat generated by the electronic devices 24 can be dissipated via at least two heat transfer routes. The heat generated by the electronic devices 24 can be removed by the air flowing over the surface of the fins 144. Alternatively, the heat generated by the electronic devices can be conducted to the top cover 112 of the thermal conductive housing 110 via the back plate 142, the cooling fins 144 and the thermal conductive buffer layer 150. Thereafter, the heat at the top cover 112 is carried away by another convection cooling system (not shown) provided by the computer casing.

To ensure the air from the air inlet 112a flows smoothly to the air outlet 112b along the flow direction F through the channels between the cooling fins 144, the air inlet 112a and the air outlet 112b are positioned on each side of the air channels. This positional arrangement facilitates the flow of cooling air through the air channels between the cooling fins 144 of the heat sink 140 so that the convection cooling capacity of the cooling system 100 is increased.

Figure 3A:
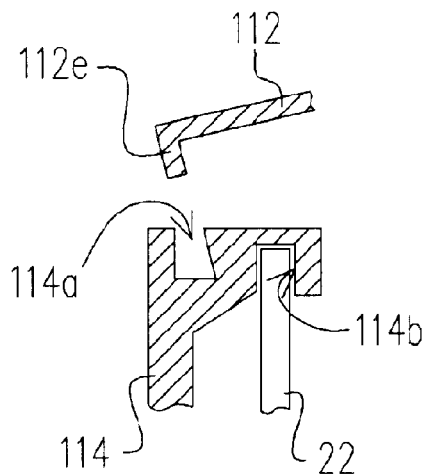
FIGS. 3A to 3C are cross-sectional views showing the design and the process of assembling the top cover and the back plate of a thermal conductive housing according to this invention.
Figure 3B:
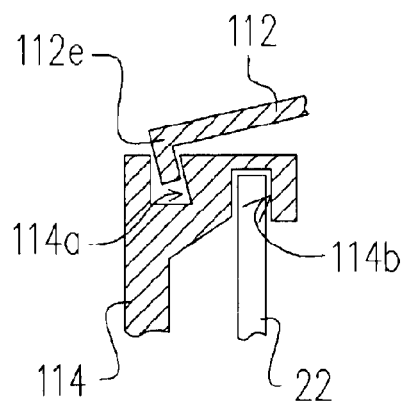
Figure 3C:
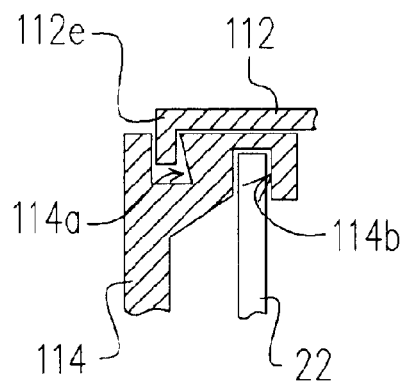

FIGS. 3A to 3C are cross-sectional views showing the design and the process of assembling the top cover and the back plate of a thermal conductive housing according to this invention. In FIG. 3A, one side edge of the top cover 112 has a latching hook 112e (the section labeled A in FIG. 1) and a corresponding side edge of the back plate 114 has a groove 114a (the section labeled B in FIG. 1) for accommodating the hook 112e. In FIG. 3B, the groove 114a has a trapezoidal cross-sectional profile while the latching hook 112e having a rectangular profile for sliding at an angle into the groove 114a. Finally, as shown in FIG. 3C, the top cover rotates in a clockwise direction (or the back plate 114 rotates in an anti-clockwise direction) so that the latching hook 112e is entirely buried within the groove 114a. Hence, the latching hook 112e and the groove 114a engage with the greatest contact area. This setup facilitates the transfer of heat from the top cover 112 by conduction through the contact between the latching hook 112e and the groove 114a to the surface of the back plate 114. Note the embodiment of this invention is not limited to the design of having a latching hook 112e on the top cover 112 and a corresponding groove 114a on the back plate 114. In fact, the positioning of the latching hook 112e and the groove 114a can be reversed so that the latching hook 112e is formed on the back plate 114 while the groove 114a is formed on the top cover 112.

Furthermore, to fix the position of the circuit carrier 22 relative to the back plate 114 or to fix the back plate 114 relative to the carrier 22, one of the side edges of the back plate 114 also has a long narrow embedding groove 114b as shown in FIG. 3A. The long narrow embedding groove 114b has a dimension that can fit in a corresponding edge of the carrier 22.

In summary, the cooling system of this invention comprises a thermal conductive housing that wraps around the circuit carrier and the electronic devices (such as graphic chips, memory chips or other devices) of an interface card (such as a graphic card). A pair of fans is also installed on the thermal conductive housing. The fans on the thermal conductive housing provide a continuous stream of cool air in the space between the interface card and the thermal conductive housing. With this setup, heat generated by the electronic devices inside the interface card during operation is rapidly carried away.

In addition, this invention also permits the attachment of fin type heat sink between the electronic devices having a high heat-generating capacity (such as a graphic chip and a memory chip) and the thermal conductive housing to increase the cooling rate even further.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A cooling system for an interface card, wherein the interface card comprises a circuit board and a connection interface, the circuit board has a circuit carrier and the connection interface is located on one side edge of the circuit carrier, the circuit carrier furthermore has a front surface, a back surface and a lead plugging section located on one side edge of the carrier, the cooling system comprising:

a thermal conductive housing, wherein the thermal conductive housing encloses at least a portion of the carrier but exposes the lead plugging section of the carrier, there is a space between the thermal conductive housing and the front surface of the carrier, and the thermal conductive housing has an air inlet and an air outlet linking up the space between the thermal conductive housing and the carrier;

an intake fan positioned over the air inlet of the thermal conductive housing; and an air exhaust fan positioned over the air outlet of the thermal conductive housing.

2. The cooling system of claim 1, wherein the air inlet and the air outlet are both located above the front surface of the circuit carrier.

3. The cooling system of claim 2, wherein the thermal conductive housing furthermore comprises an air intake guiding section and an air exhaust guiding section with the air intake guiding section set up over the air inlet and the air exhaust guiding section set up over the air outlet such that the direction of air flow into the air intake guiding section and the direction of air flow out of the air exhaust guiding section form an included angle smaller than 180°.

4. The cooling system of claim 1, wherein the system furthermore comprises a fin-type heat sink and the circuit board furthermore comprises at least an electronic device on the front surface of the circuit carrier such that the fin type heat sink is set up between the electronic device and the thermal conductive housing with the heat sink in contact with both the electronic device and the interior surface of the conductive thermal housing.

5. The cooling system of claim 4, wherein the system furthermore comprises a thermal conductive buffer layer set up between the thermal conductive housing and the fin type heat sink.

6. The cooling system of claim 4, wherein the air inlet and the air outlet are positioned over the front surface of the circuit carrier on each side of the fin type heat sink.

7. The cooling system of claim 1, wherein the thermal conductive housing furthermore comprises:

a top cover covering over the front surface of the circuit carrier; and a back plate covering over the back surface of the circuit carrier, wherein at least a side edge of the back plate is physically connected to one of the side edges of the top cover.

8. The cooling system of claim 7, wherein the side edge of the back plate and the corresponding side edge of the top cover are joined together through a detachable assembly.

9. The cooling system of claim 7, wherein the side edge of the top cover has a latching hook and the corresponding side edge of the back plate has a groove for accommodating the latching hook.

10. The cooling system of claim 7, wherein one of the side edges of the top cover has a groove and the corresponding side of the back plate has a latching hook that can be latched into the groove.

11. The cooling system of claim 7, wherein one of the side edges if the back plate has an embedding groove for accommodating one side edge of the circuit carrier.

* * * * *